United States Patent [19]
Ghosh

[11] Patent Number: 6,011,813
[45] Date of Patent: *Jan. 4, 2000

[54] BLIND EQUALIZATION METHOD AND APPARATUS HAVING REDUCED COMPLEXITY

[75] Inventor: Monisha Ghosh, Mohegan Lake, N.Y.

[73] Assignee: Philips Electronics North America Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/880,378

[22] Filed: Jun. 23, 1997

[51] Int. Cl.$^7$ .............................. H04B 10/18; H04L 27/01
[52] U.S. Cl. ............................................ 375/233; 375/350
[58] Field of Search ...................... 375/266, 343, 375/346, 348, 229, 230, 232, 233, 341, 349, 350; 364/724.19, 724.2; 329/351; 333/18; 708/323

[56] References Cited

U.S. PATENT DOCUMENTS

| | | | |
|---|---|---|---|
| 4,228,517 | 10/1980 | Constant | 364/724 |
| 5,475,710 | 12/1995 | Ishizu et al. | 375/232 |
| 5,572,262 | 11/1996 | Ghosh | 348/608 |
| 5,692,011 | 11/1997 | Nobakht et al. | 375/266 |

FOREIGN PATENT DOCUMENTS

| | | | |
|---|---|---|---|
| 0400850A2 | 12/1990 | European Pat. Off. | H03H 21/00 |
| 0711035A2 | 10/1995 | European Pat. Off. | H03H 21/00 |
| 0751619A1 | 1/1997 | European Pat. Off. | H03H 21/00 |
| 07226704 | 8/1995 | Japan | H04B 7/005 |
| 9727695 | 7/1997 | WIPO | H04L 25/03 |

OTHER PUBLICATIONS

"Multi-Stage Blind Clustering Equaliser", by S. Chen et al, IEEE Transactions on Communications, vol. 43, No. 2/3/4, Feb./Mar./Apr. 1995.

D. N. Godard "Self-Recovering Equalization and Carrier Tracking in Two-Dimensional Data Communication Systems", IEEE Trans. Commun., vol. Com-28, pp. 1867–1875, Nov. 1980.

V. Weerackody et al, "A Simple Hard-Limited Adaptive for Blind Equalization", IEEE Trans. Circuits and System II: Analog and Digital Signal Processing, vol. 39, No. 7, Jul. 1992.

*Primary Examiner*—Don N. Vo

[57] ABSTRACT

A blind equalization method and adaptive filter device is presented which provides for optimal performance with minimal computational complexity. Recognizing that all realizable filters have residual noise characteristics, the optimization of a hard-limiter adaptive filter is determined in dependence upon an estimate of this noise characteristic. The filter can be further adapted and optimized in dependence upon measured values of the filter's noise characteristics in its actual operating environment.

11 Claims, 6 Drawing Sheets

BLIND EQUALIZATION METHOD AND APPARATUS HAVING REDUCED COMPLEXITY

BACKGROUND OF THE INVENTION

1. Field of the Invention

This invention relates to the design of communications systems which employ adaptive filters. A method and device are disclosed which provides for the determination of the coefficients of adaptive filters with minimal computational complexity. Such methods and devices are particularly applicable for communications receivers operating in the presence of multipath interference.

2. Discussion of the Related Art

Adaptive filters are well known in the art. The coefficients of such filters are adjusted in dependence upon the characteristics of the received signal. This adjustment can be accomplished by transmitting a known training sequence of symbols to the receiver. The adjustment of the filter characteristics is effected by comparing the received symbols to the known transmitted symbols, so as to minimize the differences between the received and transmitted symbols. This adjustment is also termed equalization, because it has the effect of reducing, or equalizing, the effects of those environmental sources which caused the observed errors. After the adjustment, or training, of the receiver, the transmission of message symbols commences. The underlying assumption in this scenario is that the environmental conditions which caused differences in the received training symbols, compared to the transmitted training symbols, would affect the subsequent received message symbols as well, and, therefore, an adjustment to the filters which minimized errors in the received training symbols would also minimize errors in the received message symbols. As such, adaptive filters are well suited for eliminating relatively consistent interference. For example, the interference caused by the transmitted signal being reflected from surrounding structures and arriving at the receiver at slightly different times because of these reflections, or multiple paths, is relatively consistent, assuming the reflecting structures are stationary. Adaptive filters are very effective for removing the interference caused by these multiple path receptions.

In most environments, the training sequence is retransmitted periodically, to assure the correspondence of environmental conditions at the time of the training to the time of actual message reception. The period of time spent for the training will impact the overall efficiency of the communications channel, because the transmitter is unavailable for transmitting actual messages during the training period. The frequency of occurrence of such training periods is typically chosen based upon the likelihood of changes in the environmental conditions, as well as the tradeoffs between the efficiency of communication and the likelihood, and effect, of received errors. A communications channel which is subject to varying environmental conditions and which has a need for relatively error free communications will experience significant inefficiencies in using the training sequence technique for filter adaptation.

An alternative to filter adaptation based on a training sequence is to adapt the filter based upon the characteristics of the received, unknown, message symbols. This adaptation technique is termed blind equalization, because the actual transmitted symbols are unknown. Blind equalization techniques are particularly applicable when a series of transmitted signals have long-term characteristics which can be used to distinguish it from random noise. For example, a technique for encoding information into message symbols may be such that each of the possible symbols, over the long run, are equally likely to occur. Such an encoding will produce a distinctive pattern, such as might be characterized by its first, second, third, fourth, etc. statistical moments. If the received series of symbols is significantly different from the transmitted series, because of environmental effects between the transmitter and receiver, the received series will likely have a different set of statistical moments, caused by those symbols which were adversely affected by the environment. Blind equalization operates on the premise that if a filter can be adjusted to cancel, or equalize, the adverse environmental effects, the filtered series of symbols will exhibit the same long-term characteristics as the idealized, unknown, transmitted series of symbols. Conversely, adjusting a filter to produce the appropriate long-term characteristics from a received pattern, which contains the combination of the transmitted series having these long term characteristics together with adverse environmental effects, will have the effect of canceling the adverse environmental effects. To be effective, the iterative adjustment of the filter must be such that the filter converges to produce these idealized long-term characteristics, regardless of the particular characteristics of the environmental interference, within reasonable bounds.

Blind equalization techniques offer an advantage over training techniques in two regards: the equalization technique is applied to the actual message symbols, and no overhead is expended to transmit and process training symbols; and, the equalization technique can be applied continuously, so as to dynamically adapt to changing environmental conditions. In general, however, the blind equalization techniques require significantly more received symbols to converge to an equalized state.

In both the training technique and the blind equalization technique of adaptive filtering, the adjustment of the filter requires: a measure which represents the error content of a particular sample; a measure which represents a composite of these particular error measures, and is indicative of the quality of the received signal; and, a method of adjusting the filter which has the effect of minimizing the composite error measure, and thereby improving the quality of the filtered received signal. In the training technique, for example, the difference between the received symbol and the transmitted symbol is a measure of the particular error associated with that received symbol. A composite measure, or statistic, may be the average value of these errors. Such a composite, however, would not be truly representative of the quality of the received signal, because the positive and negative error measures would merely cancel each other. For this reason, other composite measures, such as the average magnitude of the errors, or the average square of the errors, is often utilized as a composite measure which is indicative of the received signal quality. The average square error is also known as the Mean Squared Error (MSE). A method which minimizes a Mean Squared Error measure is referred to as a Least Mean Square (LMS) method. For generality, the particular composite measure being minimized is termed the Cost Function, and the overall process is described as a cost minimization process.

In the blind equalization technique, the particular error measure is more difficult to define. Unlike as in the training technique, the particular transmitted symbol is unknown, and thus a direct comparison of the received symbol to the transmitted symbol cannot be performed to determine the error associated with each individual received symbol. As will be discussed, a commonly used error measure for communications systems is the CMA (Constant Modulus Algorithm), or Godard, error function [D. N. Godard, "Self-recovering Equalization and Carrier Tracking in Two-Dimensional Data Communication Systems," IEEE Trans. Commun., vol. COM-28, pp. 1867–1875, Nov. 1980]. This error measure involves a comparison of a characteristic of the received symbol (in this case, the square of its magnitude) to a target value, and a subsequent adjustment of the filter in dependence upon this comparison, multiplied by the received symbol value. The aforementioned long-term characteristics of the transmitted sequence are used to determine a target value which minimizes the cost function associated with this error function. As compared to the training technique, however, which requires one subtraction to compute the error measure, the Godard error measure requires three multiplications and one subtraction. Since the measure must be computed for each received symbol, these additional three multiplications per received symbol requires more processing time and higher hardware costs, and/or results in lower performance, as compared to the training technique of adaptive filtering.

One technique often employed to minimize the number of multiplications required for cost function minimization is to incrementally adapt the filter in dependence upon whether the characteristic of the received signal is above or below the target value, without regard to how far the characteristic was above or below the target. That is, the sign (positive/negative) of the error measure, and not its magnitude, is used as the error function for each received symbol. This less precise approach also allows for less complex operations to define the error measure. Minimization processes which employ signs are termed signed minimization processes, or hard-limiter minimization processes.

A hard-limiter alternative to the Godard error function has been developed, which eliminates the need to perform multiplications to compute the error measure for each received symbol [V. Weerackody et al, A Simple Hard-Limited Adaptive Algorithm for Blind Equalization, IEEE Trans. Circuits and Systems II: *Analog and Digital Signal Processing*, Vol. 39, No. 7, July 1992]. As will be discussed, however, this alternative does not provide an optimal solution, in that there is no target value which necessarily minimizes the cost function, even when the channel is perfectly equalized. Further, it can be shown that the appropriate choice of a target value is dependent upon the noise characteristics of the environment within which the receiver is operated. Thus, the designer of the system which employs this method must choose a target value based on an assumed environment, knowing that whatever value chosen is sub-optimal, and knowing that an environmental change will result in an indeterminable performance degradation.

SUMMARY OF THE INVENTION

It is an object of this invention to provide a method and device for blind equalization of a receiver, which minimizes the computations required to perform this equalization, while also minimizing the cost function associated with this equalization process.

A further object of this invention is to optimize the performance of this equalization in dependence upon the environmental conditions within which the receiver is operated.

This invention is premised on the recognition that, in a practical environment, a finite length blind equalizer will not produce an ideal result. The adaptive filter will be effective for eliminating relatively consistent interference, such as would be caused by multipath effects, but the output of the filter will always contain some residual noise. This residual noise will be a function of, for example, the noise which the filter itself introduces, as well as any remaining environmental interference which, because of the finite nature of the filter, are not eliminatable by the filter, even if perfectly equalized.

Rather than attempting to determine a target value which minimizes errors to produce an idealized result, a blind equalizer in accordance with this invention minimizes errors to produce the best that the filter can do, under the circumstances of its environment and its finite nature. In accordance with this invention, when the filter converges to its equalized state, the output of the filter will be the representation of the original transmit sequence, plus the residual noise. By defining the desired output in this manner, and by defining a suitable signed error measure representative of this desired output, it will be shown that a target value can be determined for a hard-limiter technique which will minimize the cost function. That is, unlike the signed-Godard approach, an optimal target value can be determined and utilized.

In a further embodiment of this invention, the residual noise is measured directly, while the receiving device is operating in its actual environment, and the optimal target value is determined and utilized based upon the actual, rather than an assumed, residual noise. This embodiment eliminates the need to determine, a priori, the environmental conditions within which the receiver will be placed, and is particularly well suited for mobile receivers.

DETAILED DESCRIPTION OF THE PREFERRED EMBODIMENT

Figure 1:
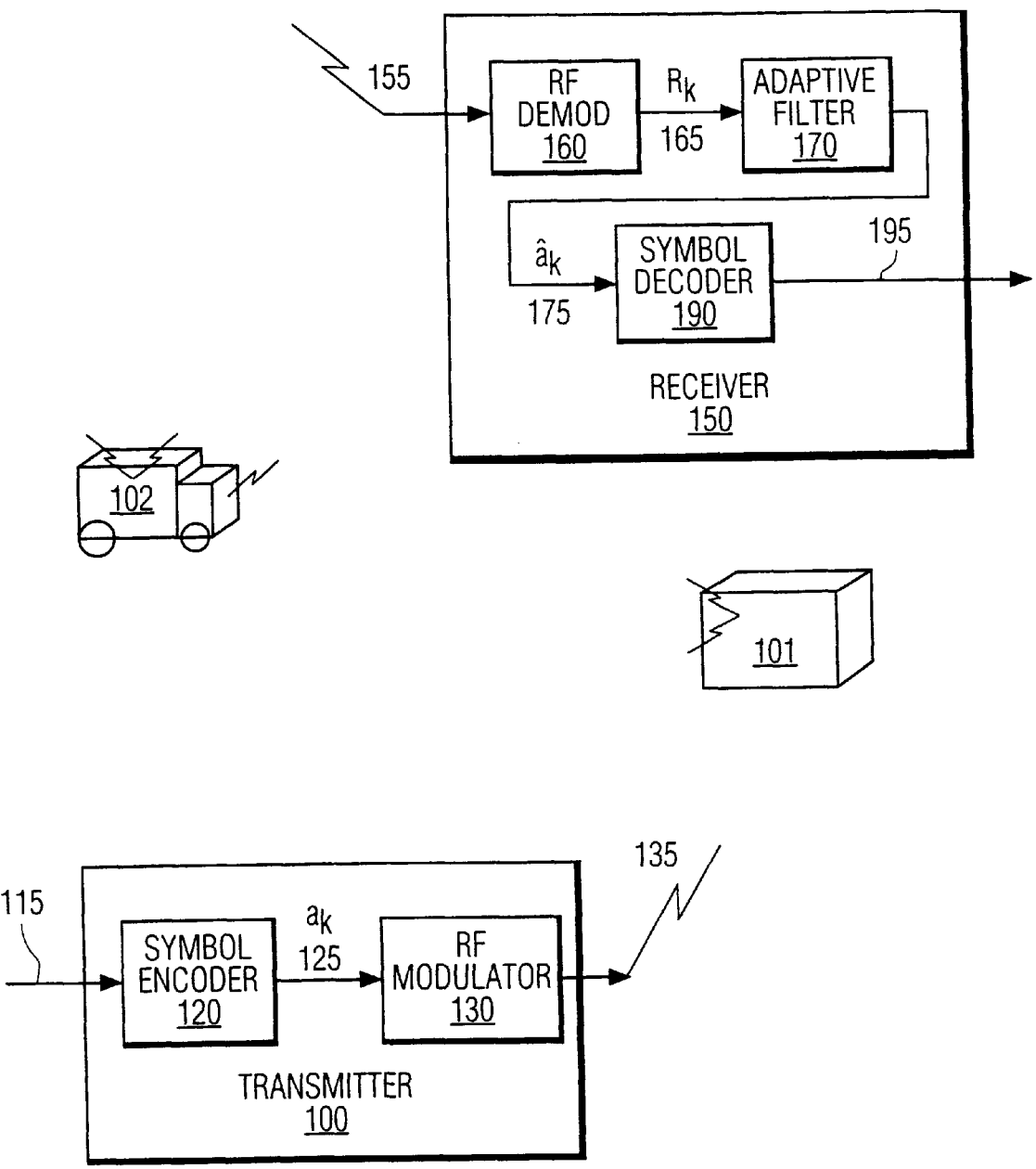
FIG. 1 shows a communications system, including a receiver with an adaptive filter.

FIG. 1 shows a communications system, comprising a transmitter 100 and a receiver 150. Shown is a radio frequency communications system, although the media and means for transmitting a signal from the transmitter to the receiver could be any method, such as cable, fiber optic, infrared, etc. Also shown are sample environmental elements which may affect an RF signal: a building 101 and a vehicle 102. Other transmitting media and means may have different environmental factors affecting the communications between the transmitter and receiver.

The information to be transmitted 115 is provided to a symbol encoder 120, which produces message symbols $a_k$ 125, sequentially in time. The message symbols are represented by $a_k$, where k is the k-th time interval in the transmission series. The symbols $a_k$ 125 are formed from a discrete set of values in accordance with known encoding techniques. The discrete set of values may be, for example, an 8-level encoding set comprising the values −7, −5, −3, −1, 1, 3, 5, and 7. The set of encoding values utilized in a particular communications system is termed the constellation of the encoding scheme. It is the encoding which produces the long term characteristics of the transmission sequence. By limiting the values of the encoding to a particular constellation, and controlling the method of encoding, long term characteristics such as an equal likelihood of occurrence of each of the values in the constellation can be maintained. The encoded symbols $a_k$ 125, having these long term characteristics, are transmitted via the RF modulator 130 as transmitted signals 135.

The transmitted signal is received by the receiver 150 as received signal 155. This received signal 155 comprises not only the transmitted signal 135 in an attenuated form, but also noise from other electromagnetic generators in the environment, such as the engine of vehicle 102, as well as reflected copies of the transmitted signal 135, which are received at different times relative to the original transmitted signal 135. Thus, received signal 155 can be considered an adversely filtered version of transmitted signal 135, with additional noise. The received signal 155 is demodulated via RF demodulator 160 to form received signal k 165, which can be written as:

$$r_k = \sum_{i=0}^{L_h-1} h_i a_{k+d_h-i} + n_k \qquad (1)$$

where $h_i$, i=0, ..., $L_h$−1, is the filter characteristics of a multipath channel of length $L_h$ and delay $d_h$, representing the environment through which the transmitted signal traveled, and $n_k$ is the additive noise. The received symbols $r_k$ are processed by the adaptive filter 170 to produce the filtered received symbol $\hat{a}_k$ 175. The carat symbol (^) is used to signify that this symbol is a quantized estimate of the transmitted signal $a_k$. It is quantized to one of the values contained in the transmitted symbol set, as will be discussed with reference to FIG. 2. The received symbol $\hat{a}_k$ 175 is decoded via decoder 190 to produce output information 195, which, ideally, is identical to the input information 115.

Figure 2:
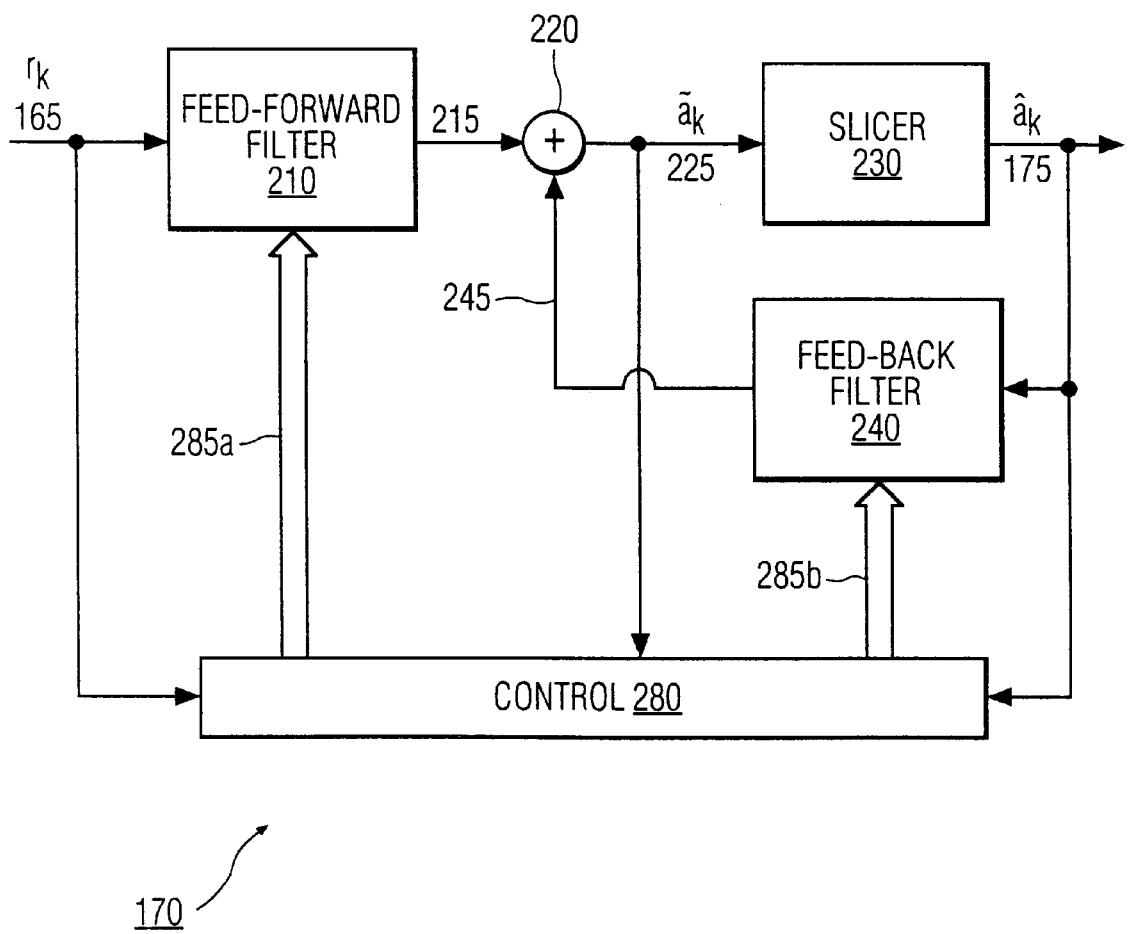
FIG. 2 shows an adaptive filter containing feed forward and feed back filter elements.

The adaptive filter 170 is shown in FIG. 2. As shown, the filter contains a feed-forward filter 210 and a feed-back filter 240. These filters have lengths of $L_f$ and $L_b$, respectively, and each of the taps of these filters can by set by control signals 285a and 285b from the control 280. The control 280 uses the received symbols $r_k$ 165, the quantized symbols $\hat{a}_k$ 175, and the filtered signal $\tilde{a}_k$ 225 to determine the setting of these filter taps. The filtered signal $\tilde{a}_k$ 225 is the sum of the outputs of the feed-forward filter 210 and the feed-back filter 240. The tilde character (~) is used to signify that this signal is an approximation of the transmitted symbol $a_k$. This filtered signal $\tilde{a}_k$ 225 is a continuous, analog, signal, and can be represented as:

$$\tilde{a}_k = \sum_{i=0}^{L_f-1} f_i r_{k+d_f-i} + \sum_{i=1}^{L_b} b_i \hat{a}_{k-d_b-i} \qquad (2)$$

where $f_i$, i=0, ... $L_f$−1 are the feed-forward equalizer taps; $b_i$, i=0, ... $L_b$ are the feed-back equalizer taps; $d_f$ is the delay through the feed-forward equalizer; and $d_b$ is the delay through the feed-back equalizer.

The transmitted symbol $a_k$ is known to be one of a discrete set of values comprising the constellation. The filtered signal $\tilde{a}_k$ 225 is quantized to one of these values, typically the one closest to the filtered signal $\tilde{a}_k$ 225, by slicer 230 to produce the filtered and quantized received symbol $\hat{a}_k$ 175.

Using the known LMS algorithm, the control 280 determines the new values of the filter taps for each iteration as follows:

$$f(k+1)=f(k)+u^*e(k)^*r(k) \qquad (3)$$

$$b(k+1)=b(k)+u^*e(k)^*a(k) \qquad (4)$$

where f(k) 285a and b(k) 285b are the vectors of the feed-forward and feed-back taps respectively at time k; u is a constant scale factor which is dependent upon the step size between time k and time k+1; r(k)=[$r_{k+df}$, $r_{k+df-1}$, ..., $r_{k+df-Lf+1}$]; a(k)=[$a_{k+df}$, $a_{k+df-1}$, ... $a_{k+df-Lf+1}$]; and e(k) is the error measure of the k-th symbol, as discussed below.

The known CMA, or Godard, error function e(k) is:

$$e(k)=\tilde{a}_k^*(|\tilde{a}_k|^2-R_G). \qquad (5)$$

As can be seen, this function requires three multiplication and one subtraction at each time interval k. Using a mean square composite measure, this error function results in the cost function $E[(|\tilde{a}_k|^2-R_G)^2]$, where E is the expected value function. $R_G$ is the constant to which the square of the magnitude of each signal $\tilde{a}_k$ is compared. This is the aforementioned target value, for which a long term sequence of idealized transmitted symbols would produce a minimum value. Thus, the optimal value of $R_G$ to be used in the receiver adaptive filter is computed as that value which minimizes the expected value of the cost function. It is determined by finding that value of $R_G$ which results in the derivative of the cost function being zero when the equalizer has converged. In an ideal system, when the equalizer converges, the filtered received signal $\tilde{a}_k$ will exactly equal the transmitted symbol $a_k$. It can be shown that by setting $\tilde{a}_k=a_k$ in the cost function, and setting the derivative of the cost function equal to zero, the optimal value of $R_G$ is:

$$R_G = \frac{E[|a_k|^4]}{E[|a_k|^2]}. \qquad (6)$$

Because $a_k$ is the transmitted sequence, having known long term characteristics, each of the expected value terms in equation (6) are determinable. For an equally likely sequence of symbols from an 8-level constellation of −7, −5, −3, −1, 1, 3, 5, 7, the value of $E[|a_k|^2]$ is 21; $E[|a_k|^4]$ is 777; and thus, $R_G$ is 37.

In accordance with this invention, the CMA/Godard algorithm is modified to reduce computational complexity by replacing the error measure with an alternative, hard-limited, error measure:

$$e_s(k)=\text{sgn}(\tilde{a}_k)^*\text{sgn}(|\tilde{a}_k|-R). \qquad (7)$$

where sgn is the sign function which produces one of two values: +1 or −1. Although one multiplication is shown in equation (7), an actual multiplication need not be performed; a mere comparison of the results of each of the sign functions will determine whether $e_s$(k), the product of two sign functions, is +1 or −1. Thus, the complexity of this expression is merely one subtraction and one comparison. This error function is similar in form to that proposed by V. Weerackody et al, cited above. As compared to the Weerackody approach, however, this error measure does not contain values in the complex plane. The cost function of this error measure by the above LMS algorithm (equations 3 and 4) is $E[||\tilde{a}_k|-R|]$.

If, as in Godard and Weerackody, one assumes that upon convergence, the received signal $\tilde{a}_k$ will be identical to the transmitted signal $a_k$, the value of R is determined by substituting $a_k$ for $\tilde{a}_k$ in the cost function, setting its derivative to zero, and solving for R. Unfortunately, however, except for some special data constellations, there is no value of $R_s$ for which the derivative of this cost function will be zero. It can be shown that, for an 8 valued constellation (−7, −5, −3, −1, 1, 3, 5, 7), any value of R between 5 and 7 produces a derivative of the cost function equal to −0.5; any other value of R gives a derivative of higher magnitude. That is, there is no value of R which assures that the cost function is minimized when the filter is equalized.

In accordance with this invention, the received signal $\tilde{a}_k$ is not assumed to be identical to the transmitted signal $a_k$. The received signal $\tilde{a}_k$ is assumed to be identical to the transmitted signal $\tilde{a}_k$ plus a residual noise component:

$$\tilde{a}_k = a_k + N_k \tag{8}$$

where $N_k$ is the sum of the additive noise through the filter, and any left over interference which is not removable by the filter, because of its finite nature. At convergence, the cost function will be $E[||a_k+N_k|-R|]$. It will be shown that, with this assumption of the presence of residual noise, values of R can be determined which minimize this cost function. It will further be shown that these values of R which minimize the cost function are a function of the characteristics of the residual noise $N_k$.

Although the noise $N_k$ will typically not be Gaussian, one can assume that, based on the law of large numbers, an approximation of this noise being Gaussian in the long run is not unreasonable. Given this assumption, that the noise $N_k$ is Gaussian with a mean of zero and a variance of $\sigma_N^2$, the derivative of the cost function, upon convergence, will be:

$$d(R) = E[a_k \operatorname{sgn}(a_k + N_k)\operatorname{sgn}(|a_k + N_k| - R)] \tag{10}$$

$$d(R) = \sum_{a \in A} ap(a) \int_{-\infty}^{+\infty} \operatorname{sgn}(a+N)\operatorname{sgn}(|a+N|-R) \frac{e^{-\frac{N^2}{2\sigma_N^2}}}{\sigma_N \sqrt{2\pi}} dN \tag{11}$$

$$= \sum_{a \in A} ap(a) * \left[ -\int_{-\infty}^{-R-a} \frac{e^{-\frac{N^2}{2\sigma_N^2}}}{\sigma_N \sqrt{2\pi}} dN + \int_{-R-a}^{-a} \frac{e^{-\frac{N^2}{2\sigma_N^2}}}{\sigma_N \sqrt{2\pi}} dN - \right. \tag{12}$$

$$\left. \int_{-a}^{R-a} \frac{e^{-\frac{N^2}{2\sigma_N^2}}}{\sigma_N \sqrt{2\pi}} dN + \int_{R-a}^{\infty} \frac{e^{-\frac{N^2}{2\sigma_N^2}}}{\sigma_N \sqrt{2\pi}} dN \right]$$

$$d(R) = \sum_{a \in A} ap(a)\left[1 + 2Q\left(\frac{R-a}{\sigma_N}\right) - 2Q\left(\frac{-a}{\sigma_N}\right) - 2Q\left(\frac{R+a}{\sigma_N}\right)\right] \tag{13}$$

where a is an element within constellation A, p(a) is the probability of occurrence of element a, and Q(y) is defined as the function:

$$Q(y) = \frac{1}{\sqrt{2\pi}} \int_y^\infty e^{-\frac{x^2}{2}} dx \tag{14}$$

As can be seen by the arguments of the Q function in the above equations, the derivative of the cost function is dependent upon the characteristic of the noise, $\sigma_N$, and in particular to the ratio of the (R−a), (−a), and (R+a) terms to this noise characteristic. Thus, the optimum value of R to minimize this cost function is dependent upon the constellation utilized, and the variance of the residual noise $N_k$.

For an eight value constellation (−7, −5, −3, −1, 1, 3, 5, 7), having an equal likelihood of occurrence (p(a)=1/8), the derivative of the cost function is:

$$d(R) = \frac{1}{4} \sum_{a \in (1,3,5,7)} a\left[1 + 2Q\left(\frac{R-a}{\sigma_N}\right) - 2Q\left(\frac{-a}{\sigma_N}\right) - 2Q\left(\frac{R+a}{\sigma_N}\right)\right]. \tag{14}$$

Figure 3:
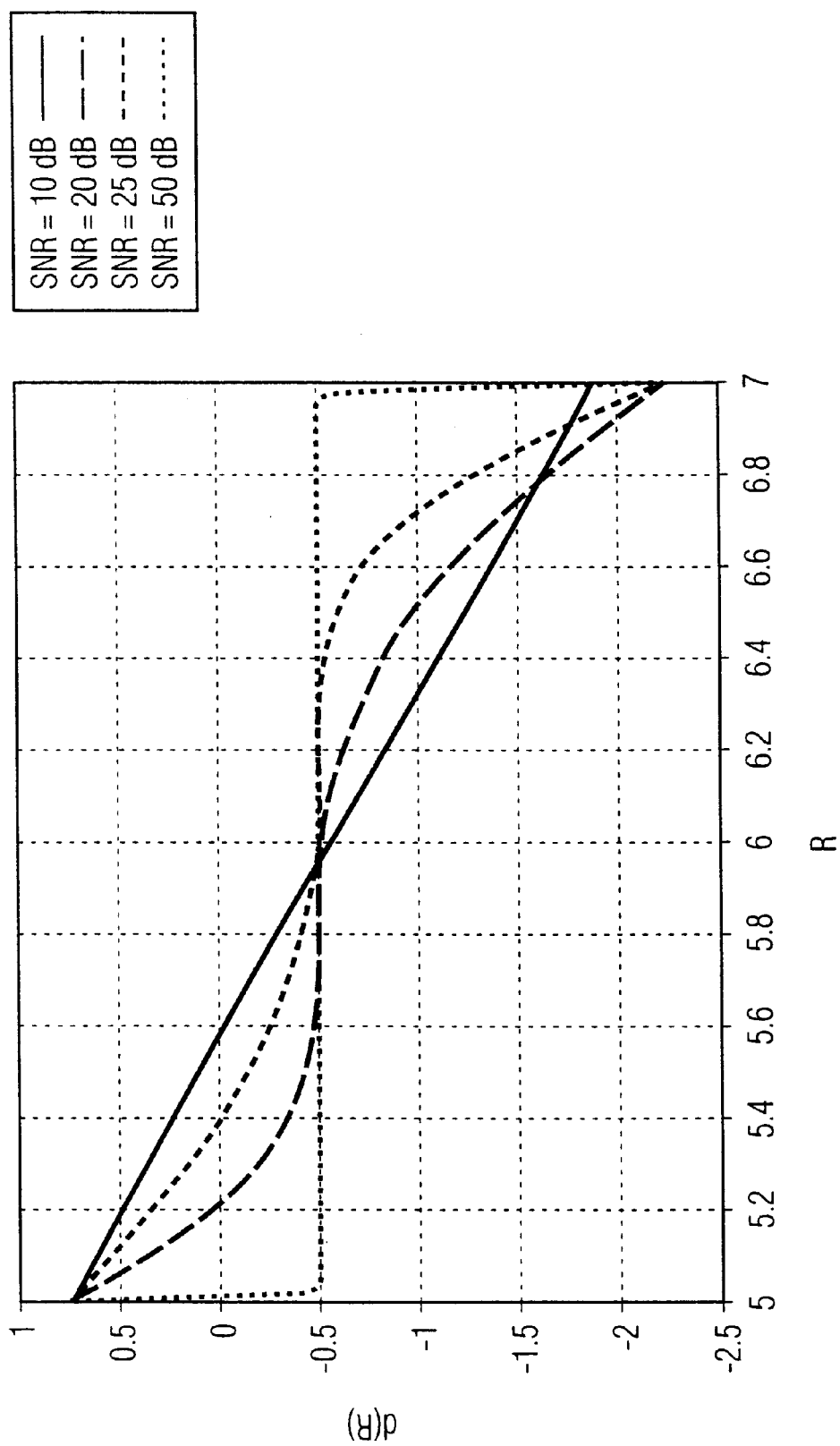
FIG. 3 shows a plot of the derivative of the cost function for various levels of received Signal to Noise ratios.

A closed form solution for this equation is not available, but table 1 provides a set of values of R and $\sigma_N^2$ which, when applied to the above equation (14) result in a derivative of zero. That is, given the characteristic of the noise $N_k$, in terms of its variance $\sigma_N^2$, a value of R which minimizes the cost function can be found. Also shown in table 1 is the Signal to Noise Ratio (SNR) of the received signal, which is defined as $10*\log(\sigma_a^2/\sigma_N^2)$. A plot of the derivative cost function for select values of the SNR are shown in FIG. 3. The intersection of these plots with the derivative value of zero, at 310, 320, 325, and 350, corresponding to SNRs of 10, 20, 25, and 50 dB respectively. As is apparent to one skilled in the art, similar tables and plots can be developed for other encoding constellations from equation (13). Either the SNR or the noise variance can be used to determine the appropriate value of R to use for the signed error measure given in equation (5).

TABLE 1

SNR and Variance vs. R for a {−7, −5, −3, −1, 1, 3, 5, 7} constellation

| SNR (dB) | $\sigma_N^2$ | R |
|---|---|---|
| 15.0 | 0.6641 | 5.5872 |
| 16.0 | 0.5275 | 5.5680 |
| 17.0 | 0.4190 | 5.5350 |
| 18.0 | 0.3328 | 5.4899 |
| 19.0 | 0.2644 | 5.4392 |
| 20.0 | 0.2100 | 5.3900 |
| 21.0 | 0.1668 | 5.3458 |
| 22.0 | 0.1325 | 5.3071 |
| 23.0 | 0.1052 | 5.2733 |
| 24.0 | 0.0836 | 5.2434 |
| 25.0 | 0.0664 | 5.2169 |

Figure 4:
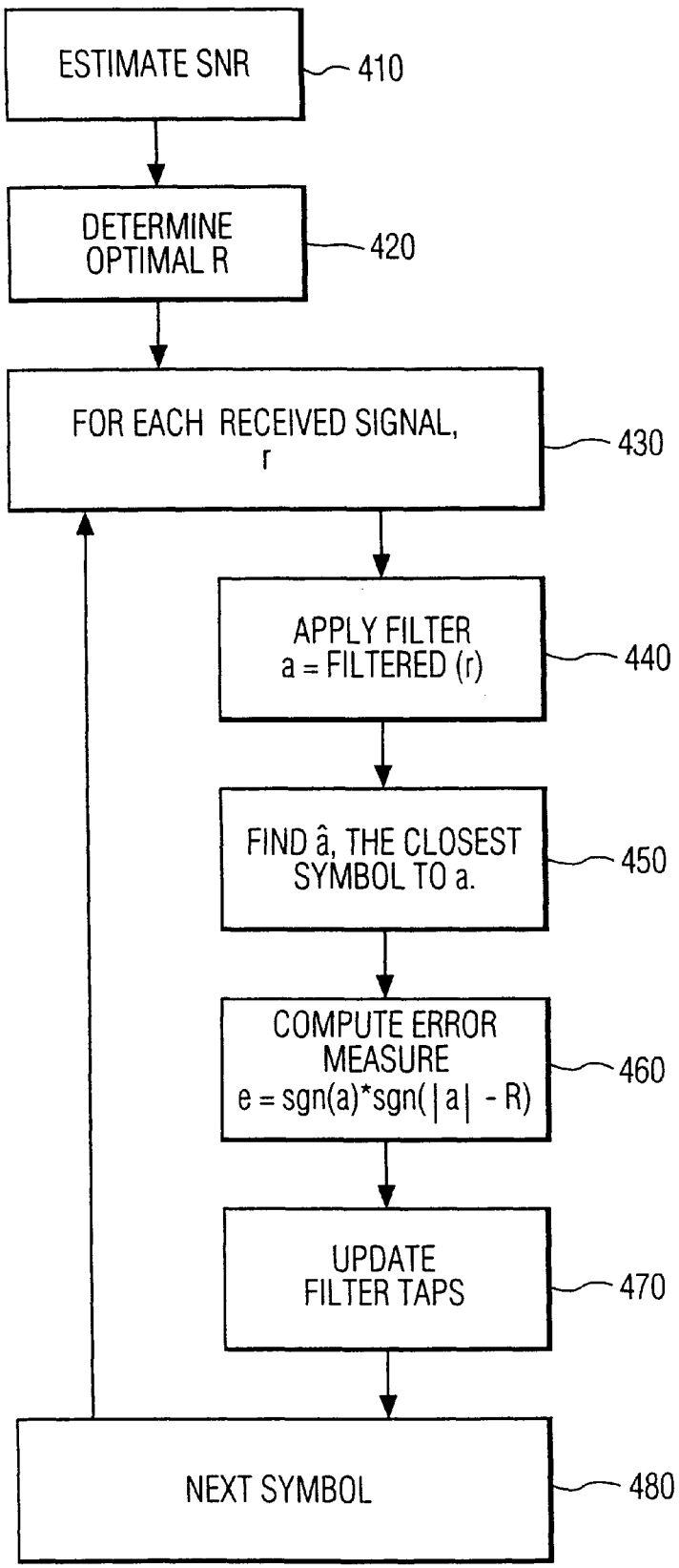
FIG. 4 shows a flowchart for adapting filter taps in accordance with this invention.

FIG. 4 shows a flowchart for implementing an adaptive filter in accordance with this invention. Before commencing the processing of received symbols, the SNR of the residual noise is estimated at 410. Such an estimate is a common design parameter used to develop a communications system for a particular expected environment. This estimate is based upon the inherent characteristics of the adaptive filter as designed, and the expected environmental characteristics in relation to the expected capabilities of the filter. With this estimate, the value of R which will minimize the cost function for the constellation utilized in this system is determined at 420, using the equation 13 above, or, if the constellation is eight valued as discussed above, the appropriate value of R can be found in Table 1 corresponding to the estimated SNR.

After R is determined, the processing of received symbols commences at 430. Each received signal is processed by the adaptive filter to produce a filtered signal at 440. The constellation symbol value which is closest to this filtered value is determined at 450. This is the symbol value $\hat{a}_k$ which is presented to the subsequent decoding element, block 190 in FIG. 1. For each filtered signal, an error measure is computed at 460. This error measure is then used to update the filter taps at 470. Block 470 implements equations (3) and (4), above, to perform the update of the filter taps. Having determined the closest symbol value at 450, and updated the filter taps at 470, block 480 loops back to block 430 to process the next received signal. As shown, the receiver continually updates the filter taps in dependence upon a comparison of the filtered signal to the value R computed at 420, thereby assuring that environmental changes are continually adapted for.

Figure 6:
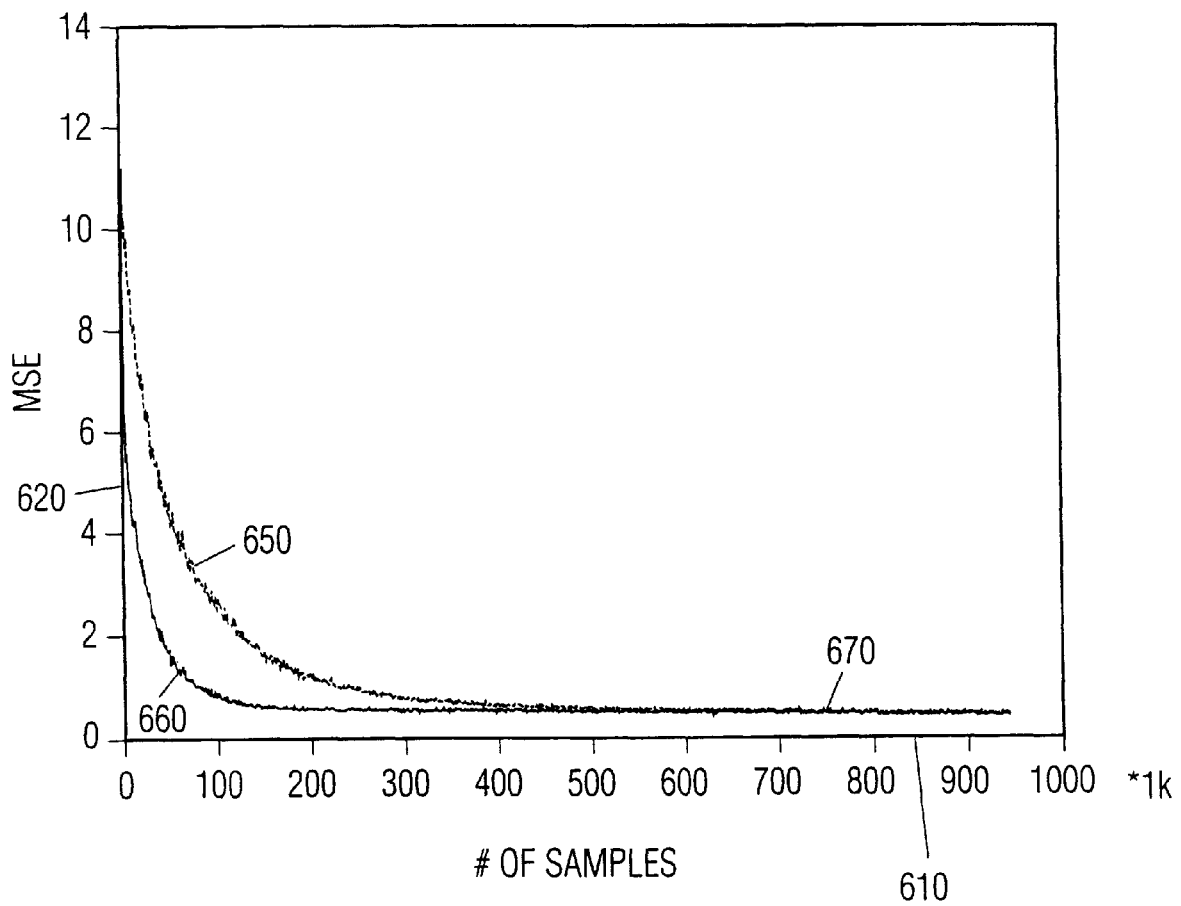
FIG. 6 is a plot of the Mean Square Error of an adaptive filter as a function of the number of samples used for both the present invention and a prior art method.

FIG. 6 shows the results of a sample simulation of the adaptive filter in accordance with this invention 650, as compared to Godard's 660. The horizontal axis 610 is the number of samples processed, and the vertical axis 620 is the resultant Mean Square Error (MSE). As can be seen, this invention 650 achieves similar long term results as Godard's 660, although it does not converge to the long term result 670 as quickly as Godard's. The computational complexity, in terms of the mathematical operations which need be performed for each sample, however, is considerably reduced through the use of this invention, albeit at the cost of a reduced convergence rate. If a higher rate of convergence is required, convergence can be achieved more quickly through the use of filter step size adaptation and optimization techniques, as is common in the art of adaptive filter design.

Figure 5:
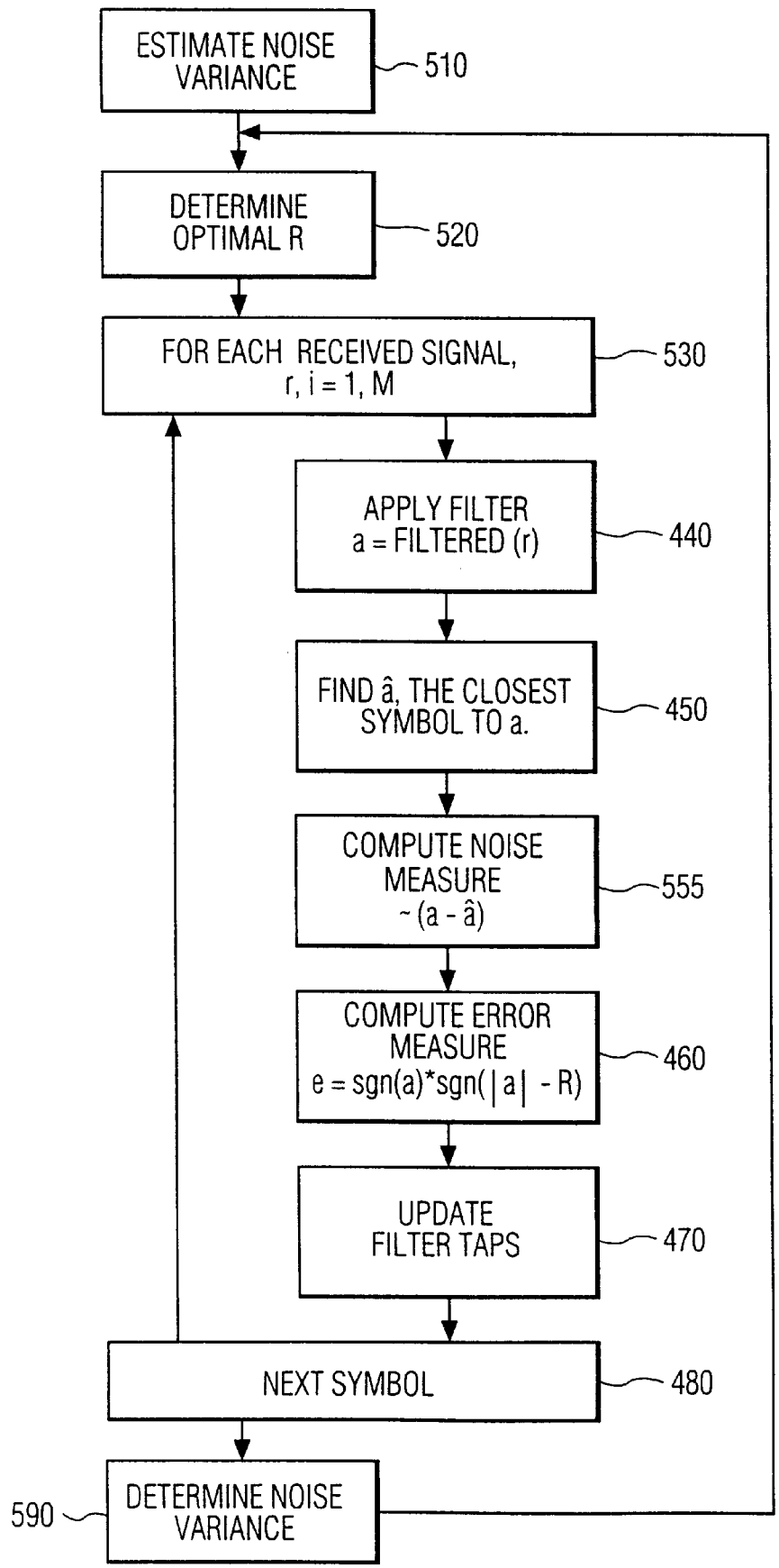
FIG. 5 shows a flowchart for optimizing the filter in dependence upon the measured residual noise at the output of the filter, in accordance with this invention.

FIG. 5 shows a flowchart for further optimizing the implementation of this method. As can be seen from the plots of FIG. 3, the choice of an incorrect estimate of the SNR of the noise can result in a suboptimal choice of R. The flowchart of FIG. 4 can be modified to dynamically adjust the choice of R in dependence upon the observed characteristics of the residual noise, rather than relying solely on the initial noise estimate. In this embodiment, the variance of the expected noise is initially estimated at 510. From this estimate, the optimal value of R is chosen, per equation 13, or, per table 1 for an eight valued constellation. The processing of each sample is similar to that shown in FIG. 4, and similar function blocks are referenced by the same numerals as in FIG. 4. As compared to FIG. 4, after every M samples, as controlled by the for-loop 530-480, a new estimate of the noise variance is determined at 590. As shown, this new estimate of the noise variance is determined based upon the noise measure of each of the filtered signals at 555. In this embodiment, the noise is measured by comparing the filtered signal to the nearest symbol in the constellation. Other techniques may be employed to provide for a revised estimate of the variance of the noise, as is common in the art. After computing this revised estimate, based on the actual performance of the filter, the choice of R is redetermined, based on this revised estimate, at 520, and the next set of M samples are processed. The choice of M is rather broad. It should be large enough so as to provide a reasonable estimate of the variance, for example at least a few hundred samples, yet small enough to accommodate for changing environmental conditions, for example not more than a few minutes worth of samples.

By periodically reestimating the residual noise variance, based upon the observed, current, characteristics of the received filtered signal, the chosen value of R may be continually adjusted to provide for continued optimal results despite environmental changes.

The foregoing merely illustrates the principles of the invention. It will thus be appreciated that those skilled in the art will be able to devise various arrangements which, although not explicitly described or shown herein, embody the principles of the invention and are thus within its spirit and scope.

I claim:

1. A communications device for processing received signals, said received signals being representative of transmitted symbols having a long term characteristic, said communications device comprising:

filtering means for filtering the received signal to produce a filtered signal, said filtered signal representing the transmitted symbol combined with residual noise, said residual noise including noise introduced by said filtering means and noise which is not eliminated by said filtering means, said residual noise being characterized by a noise factor, said filtering means having filter taps which are adjustable, means for comparing said filtered signal to an optimization parameter to produce an error measure, and, means for adjusting said adjustable filter taps in dependence upon said error measure, the optimization parameter being dependent upon the long term characteristic of the transmitted symbols and said optimization parameter further based upon the existence of the noise factor of the residual noise.

2. A communications device as in claim 1, wherein said filtered signal has a sign and a magnitude and said error measure is dependent upon:

the sign of the filtered signal, and the sign of the difference between the magnitude of the filtered signal and the optimization parameter.

3. A communications device as in claim 1, wherein the noise factor is the variance of the residual noise.

4. A communications device as in claim 3, wherein the transmitted symbols are selected from the set of values of (−7, −5, −3, −1, 1, 3, 5, 7), further characterized in that the optimization parameter is between 5 and 7.

5. A communications device as in claim 4, further characterized in that the optimization factor decreases as the noise factor decreases.

6. A communications device as in claim 1, wherein, the transmitted symbols are from a set A, seach symbol, a, within said set has a likelihood of transmission of p(a), the set A and the likelihood of transmission p(a) comprising the said long term characteristic of the transmitted symbols, the noise factor of the residual noise is $\sigma_N$, and the optimization factor is R, where R is the value of the optimization factor for which the following equation is equal to zero:

$$\sum_{a \in A} ap(a) \left[ -\int_{-\infty}^{-R-a} \frac{e^{-\frac{N^2}{2\sigma_N^2}}}{\sigma_N \sqrt{2\pi}} dN + \int_{-R-a}^{-a} \frac{e^{-\frac{N^2}{2\sigma_N^2}}}{\sigma_N \sqrt{2\pi}} dN - \int_{-a}^{R-a} \frac{e^{-\frac{N^2}{2\sigma_N^2}}}{\sigma_N \sqrt{2\pi}} dN + \int_{R-a}^{\infty} \frac{e^{-\frac{N^2}{2\sigma_N^2}}}{\sigma_N \sqrt{2\pi}} dN \right].$$

7. A communications device as in claim 1, further comprising means for determining the noise factor in dependence upon previously received signals.

8. A communications device for processing received signals, said received signals being representative of transmitted symbols having a long term characteristic, said communications device comprising:

a feed-forward filter having a feed-forward input an feed-forward output, said received signals being provided to the feed-forward input, said feed-forward output being dependent upon said feed-forward input and upon a set of feed-forward filter coefficients, a feed-back filter having a feed-back input, and a feed-back output, said feed-back output being dependent upon said feed-back input and upon a set of feed-back filter coefficients, a summer, which combines the output of the feed-forward filter and the output of the feed-back filter to form a filtered signal, a slicer, which accepts the filtered signal and produces a quantized signal, said quantized signal being provided to said feed-back input, and to a controller, said controller, accepts as inputs the received signal, the filtered signal, and the quantized signal, and produces as output the feed-forward filter coefficients and the feed-back filter coefficients, the controller produces the feed-forward and feed-back filter coefficients in dependence upon the long term characteristic of the transmitted symbols, and in dependence upon a noise factor, so that said filtered signal represents said received signal combined with residual noise, said noise factor being based upon said residual noise associated with the filtered signal, said residual noise being produced by noise introduced by said feed-forward and feed-back filters and from noise which is not eliminated by said filters.

9. A communications device as in claim 8, wherein the controller comprises:

means for comparing the filtered signal to an optimization factor to produce an error factor, and means for computing the feed-forward and feed-back filter characteristics in dependence upon the error factor, said optimization factor being dependent upon the long term characteristic of the transmitted symbols, and the noise factor associated with the filtered signal.

10. A method for adjusting the taps of a filter, said filter being characterized as having residual noise after the adjustment of the filter, said method comprising the steps of:

estimating the residual noise of the filter, computing an optimization factor which is dependent upon a known transmission characteristic and upon the residual noise of the filter, receiving a received signal from a transmitter having said known transmission characteristic, filtering the received signal to form a filtered signal, said filtered signal representing said received signal combined with said residual noise, comparing said filtered signal to the optimization factor to produce an error factor, adjusting the taps of the filter in dependence upon said error factor.

11. A method as in claim 10, wherein the estimation of the residual noise of the filter is performed by measuring a noise factor associated with previously received filtered signals, and computing the residual noise in dependence upon the noise factor of previously received filtered signals.

* * * * *